(12) United States Patent
Sfikas et al.

(10) Patent No.: US 8,471,611 B2
(45) Date of Patent: Jun. 25, 2013

(54) FRACTIONAL-N PHASE LOCKED LOOP BASED ON BANG-BANG DETECTOR

(75) Inventors: Georgios Sfikas, Glyfada (GR); Emmanouil Frantzeskakis, Ilioupolis (GR)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/466,760

(22) Filed: May 8, 2012

(65) Prior Publication Data

US 2013/0113536 A1    May 9, 2013

Related U.S. Application Data

(60) Provisional application No. 61/556,094, filed on Nov. 4, 2011.

(30) Foreign Application Priority Data

May 4, 2012    (GR) ................................ 2012100244

(51) Int. Cl.
*H03L 7/06* (2006.01)

(52) U.S. Cl.
USPC ......................................... 327/156; 327/147

(58) Field of Classification Search
USPC ................................................. 327/147, 156
See application file for complete search history.

(56) References Cited

U.S. PATENT DOCUMENTS

| | | | |
|---|---|---|---|
| 6,765,445 B2 * | 7/2004 | Perrott et al. .................... | 331/17 |
| 7,282,972 B2 * | 10/2007 | Lin ................................ | 327/158 |
| 7,378,888 B2 * | 5/2008 | Sato ............................... | 327/158 |
| 7,400,181 B2 * | 7/2008 | Metz et al. ...................... | 327/149 |
| 2002/0089356 A1 * | 7/2002 | Perrott et al. .................. | 327/105 |
| 2004/0263225 A1 * | 12/2004 | Perrott et al. .................. | 327/156 |
| 2006/0279342 A1 * | 12/2006 | Blodgett ........................ | 327/158 |
| 2007/0024335 A1 * | 2/2007 | Sato .............................. | 327/158 |
| 2007/0052463 A1 * | 3/2007 | Abel et al. ...................... | 327/158 |
| 2007/0075759 A1 * | 4/2007 | Metz et al. ..................... | 327/158 |
| 2009/0146707 A1 * | 6/2009 | Shin .............................. | 327/158 |
| 2011/0241742 A1 * | 10/2011 | Kim et al. ....................... | 327/158 |
| 2012/0154001 A1 * | 6/2012 | Seo ............................... | 327/158 |
| 2012/0187993 A1 * | 7/2012 | Kanno et al. ................... | 327/158 |
| 2012/0268181 A1 * | 10/2012 | Fujimaki ........................ | 327/158 |

OTHER PUBLICATIONS

Tasca, Davide et al, "A 2.9-4.0-GHz Fractional-N Digital PLL With Bang-Bang Phase Detector and 560-$fs_{rms}$ Integrated Jitter at 4.5-mW Power," IEEE Journal of Solid-State Circuits, vol. 46, No. 12, Dec. 2011, pp. 2745-2758.

* cited by examiner

*Primary Examiner* — Adam Houston
(74) *Attorney, Agent, or Firm* — Sterne, Kessler, Goldstein & Fox P.L.L.C.

(57) ABSTRACT

The present disclosure is directed to a fractional-N digital phase locked loop (DPLL) that replaces the conventionally used time-to-digital converter (TDC) based phase detector with a bang-bang phase detector (BBPD). Compared to the TDC based phase detector, the BBPD has an often superior resolution for the same or similar amount of power and/or area consumption. Therefore, replacing the TDC based phase detector with a BBPD can reduce, or even eliminate, the common problem of spurs being added to the output signal generated by the DPLL because of the limited resolution of the TDC based phase detector. This can allow the DPLL to be used for the most demanding applications, such as in generating local oscillator signals for down-converting and demodulating weak signals received by a communication device, such as a cellular phone.

19 Claims, 9 Drawing Sheets

FRACTIONAL-N PHASE LOCKED LOOP BASED ON BANG-BANG DETECTOR

CROSS REFERENCE TO RELATED APPLICATIONS

This application claims the benefit of U.S. Provisional Patent Application No. 61/556,094, filed Nov. 4, 2011.

FIELD OF THE INVENTION

This application relates generally to phase-locked loops (PLLs) and more particularly to fractional-N PLLs.

BACKGROUND

In a phase-locked loop (PLL), a phase frequency detector compares the phase and frequency of an output signal that is generated by a variable frequency oscillator to the phase and frequency of an input "reference" signal. Based on the comparison, the PLL adjusts the variable frequency oscillator to establish and maintain a constant phase relationship between the output signal and the input signal. Once the phase difference between the two signals becomes substantially constant in time, the PLL is said to be "in lock."

Often, rather than comparing the phase and frequency of the output signal directly to the phase and frequency of the input signal, a frequency divider is used to first reduce the frequency of the output signal by a division factor to generate a comparison signal. The phase frequency detector then compares the phase and frequency of the comparison signal to the phase and frequency of the input signal and any adjustment needed to the variable frequency oscillator is made based on this comparison.

In a digital PLL (DPLL), the phase frequency detector is often implemented as (or at least includes) a time-to-digital converter (TDC). In general, a TDC is configured to measure the unknown time interval $T_{int}$ between a rising edge of the comparison signal, generated by the frequency divider of the DPLL, and the next rising edge of the input signal that follows thereafter. The phase difference between the comparison signal and the input signal is, by definition, proportional to this unknown time interval $T_{int}$ when the frequencies of the two signals are equal.

Figure 1:
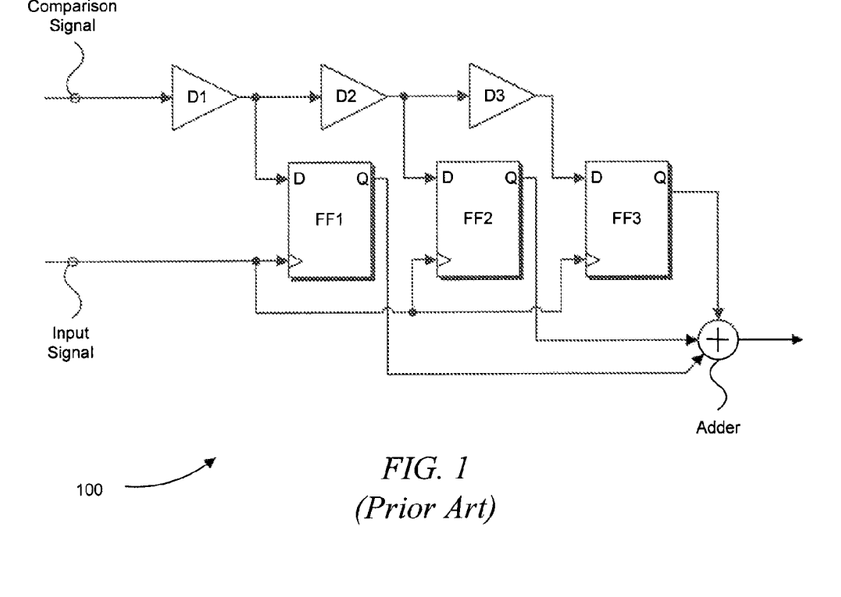
FIG. 1 illustrates a delay chain time-to-digital converter (TDC).

In at least one implementation of the TDC, the TDC measures the unknown time interval $T_{int}$ by counting how many intervals of a known reference duration $T_r$ are included in the unknown time interval $T_{int}$. FIG. 1 illustrates one such implementation of a TDC 100 referred to as a delay chain TDC. The TDC 100 is used as a phase detector in a DPLL as discussed above and includes delay gates D1-D3 (e.g., buffers or inverters) and flip-flops FF1-FF3. In operation, the comparison signal, produced by the frequency divider of the DPLL in which the TDC 100 is implemented, is successively delayed by the delay gates D1-D3 that each (ideally) has a propagation delay equal to the known reference duration $T_r$. Upon a rising edge of the input signal being received by the flip-flops F1-F3, the output of each delay gate is sampled and stored in a respective one of the flip-flops FF1-FF3.

The combined output of the flip-flops FF1-FF3 represents a code and this code is fed to an adder as shown in FIG. 1. The number of logical ones in this code corresponds to the number of the delay gates D1-D3 that the rising edge of the comparison signal was able to propagate through before the rising edge of the input signal was received by the flip-flops FF1-FF3. Because the propagation delay of each delay gate D1-D3 is known to be (ideally) equal to the reference duration $T_r$, counting the number of logical ones in this code using the adder effectively counts the number of intervals of the known reference duration $T_r$ that are included in the unknown time interval $T_{int}$. Thus, this count produced by the adder can be used to estimate the unknown time interval $T_{int}$ and, thereby, the difference in phase between the comparison signal and the input signal.

Figure 2:
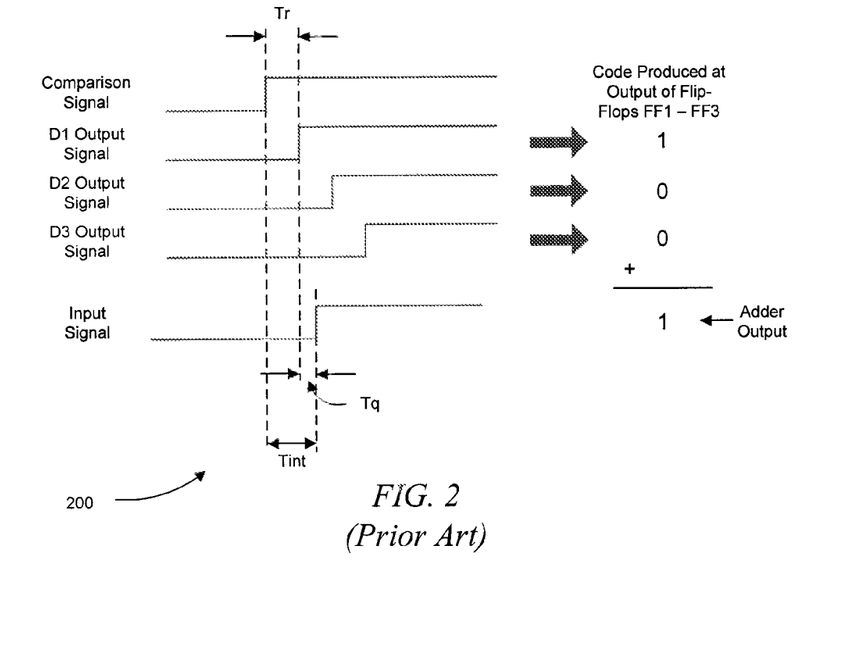
FIG. 2 illustrates a signal waveform for the TDC depicted in FIG. 1.

FIG. 2 provides an example signal waveform 200 that further illustrates the operation of the TDC 100. As can be seen from the signal waveform 200, the comparison signal is successively delayed by the delay gates D1-D3 that each have a propagation delay (ideally) equal to the known reference duration $T_r$. Upon the rising edge of the input signal being received by the flip-flops F1-F3, the outputs of the delay gates D1-D3 are respectively sampled and stored in the flip-flops F1-F3. The output of the flip-flops F1-F3 after being clocked by the rising edge of the input signal is shown to the right of the signal waveform 200. Based on the number of logical ones in the code represented by the combined output of the flip-flops F1-F3, the TDC 100 measures the unknown time interval $T_{int}$ between the rising edge of the comparison signal and the rising edge of the input signal. In this instance, the TDC 100 measures the unknown time interval $T_{int}$ to include, and therefore be equal to, one interval of the known reference duration $T_r$.

The resolution at which the TDC 100 measures the unknown time interval $T_{int}$ is generally limited by the propagation delay of the delay gates D1-D3, which are implemented using a buffer or inverter gate for example. In FIG. 2, the measurement of the unknown time interval $T_{int}$ is off by an amount equal to $T_q$ (referred to as quantization noise) due to the finite delay of the delay gates D1-D3. This quantization noise can increase the phase noise in the output signal generated by the DPLL.

In addition, the limited resolution of the TDC 100 can introduce spurs in the output signal generated by the DPLL when the difference in phase between the input signal and the comparison signal is relatively small, such as when the DPLL is in lock. In many devices, these added spurs are intolerable and/or can cause significant performance issues. For example, in a communication device, such as a cellular phone, the added spurs can prevent the communication device from adequately down-converting and demodulating weak signals that it receives using the output signal generated by the DPLL.

Although the resolution at which the TDC 100 measures the unknown time interval $L_{int}$ can be increased by reducing the propagation delay of the delay gates in its delay chain, the propagation delay can only be reduced so far due to, for example, power and area constraints for a given process technology.

In addition, although other TDC architectures have been suggested to increase resolution, such as the Vernier TDC and the gated ring oscillator TDC, these architectures generally either fall short of increasing the resolution to acceptable levels for many devices, introduce other sources of noise into the output signal generated by the DPLL, and/or consume too much power.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The embodiments of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

I. OVERVIEW

A digital phase-locked loop (DPLL) has several advantages over an analog phase-locked loop (APLL). For example, the DPLL is generally more compact than the APLL. It can take advantage of decreasing process geometry sizes for integrated circuits and can avoid large loop filter capacitors that are common to the APLL. For this reason and others, the DPLL has become increasingly more prevalent in a wide variety of applications, including in frequency synthesizers, clock and data recovery, and direct modulators.

In the conventional DPLL, the phase frequency detector is conventionally implemented as (or at least includes) a time-to-digital converter (TDC). However, as noted above, the limited resolution of a TDC can lead to spurs being introduced into the output signal produced by the DPLL. In many devices, these added spurs are intolerable and/or can cause significant performance issues. For example, in a communication device, such as a cellular phone, the added spurs can prevent the communication device from adequately down-converting and demodulating weak signals that it receives using the output signal generated by the DPLL.

The present disclosure is directed to a DPLL that replaces the conventionally used TDC with a bang-bang phase detector (BBPD). Compared to the TDC based phase detector, the BBPD has an often superior resolution for the same or similar amount of power consumption. Therefore, replacing the conventionally used TDC based phase detector with a BBPD can reduce, or even eliminate, the common problem of spurs being added to the output signal generated by the DPLL. This can allow the DPLL to be used in the most demanding applications, such as in generating local oscillator signals for down-converting and demodulating weak signals received by a communication device.

For example, the DPLL can be used as a frequency synthesizer in a cellular phone or modem operating in accordance with a particular standard (e.g., long-term evolution (LTE), Worldwide Interoperability for Microwave Access (WiMAX), or one of the IEEE 802.11 standards) and can generate local oscillator signals and other signals for down-converting and/or demodulating weak signals received by the devices.

II. GENERAL ARCHITECTURE OF FRACTIONAL-N DIGITAL PHASE-LOCKED LOOP WITH A BANG-BANG PHASE DETECTOR

Figure 3:
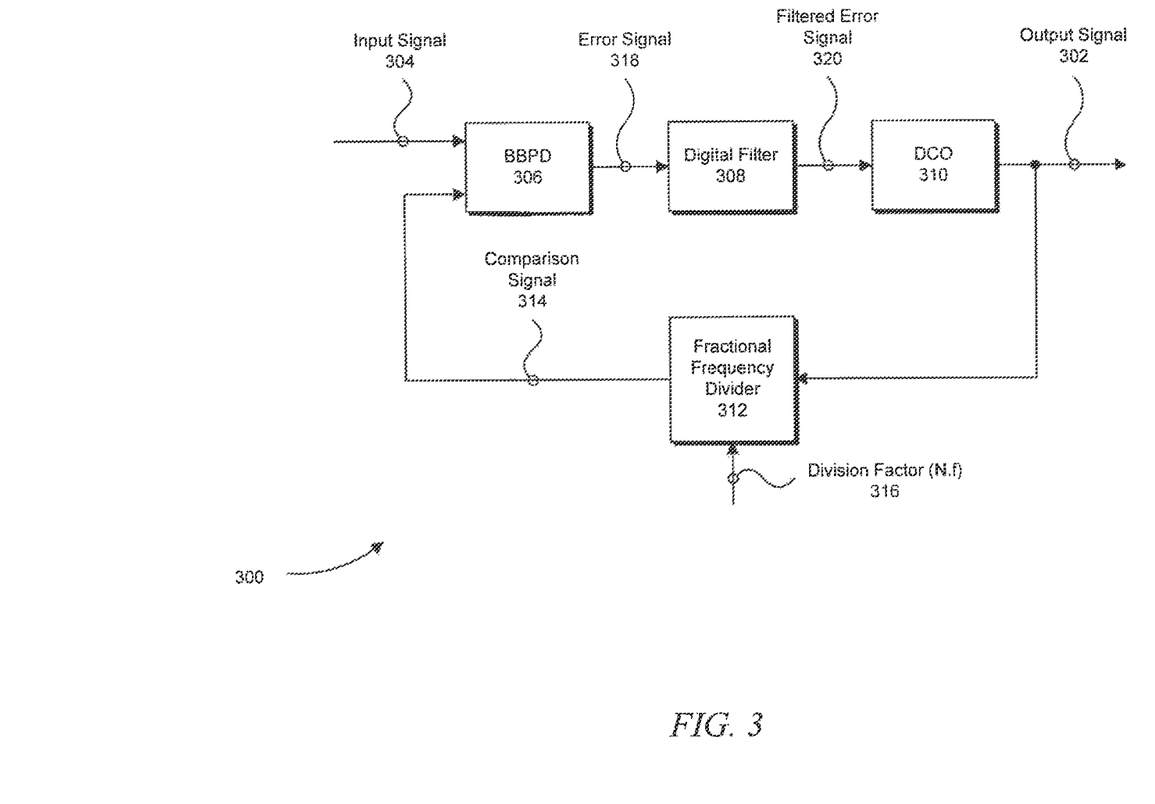
FIG. 3 illustrates a digital PLL (DPLL) with a bang-bang phase detector (BBPD).

FIG. 3 illustrates a DPLL 300 in which embodiments of the present disclosure can be implemented. In general, the DPLL 300 is used to generate an output signal 302 having a desired output frequency from an input signal 304 having a given reference frequency. Often, the output signal 302 is a relatively high frequency signal and the input signal 304 is a relatively low frequency signal. Accordingly, the DPLL 300 is used to generate the high frequency output signal 302 from the lower frequency input signal 304.

As shown in FIG. 3, the DPLL 300 includes a bang-bang phase detector (BBPD) 306 that acts as a phase (and potentially frequency) detector, a digital filter 308, a digitally controlled oscillator (DCO) 310, and a fractional frequency divider 312. The fractional frequency divider 312 generates a comparison signal 314 based on the output signal 302. Specifically, the fractional frequency divider 312 reduces the frequency of the output signal 302 by a division factor 316 that includes an integer (N) and fractional part (f). This reduction in frequency allows the output signal 302 to be generated at frequencies higher than the frequency of the input signal 304.

The BBPD 306 generates an error signal 318 based on the difference in phase (and potentially frequency) between the input signal 304 and the comparison signal 314. The BBPD 306 can be, for example, a binary or three-level output phase detector. In either implementation of BBPD 306, the error signal 318 indicates whether the comparison signal 314 is leading or lagging the input signal 304 and does not include information as to the magnitude of the difference in phase between the input signal 304 and the comparison signal 314.

The digital filter 308 low-pass filters the error signal 318 to produce a filtered error signal 320. The filtered error signal 320 is then applied to the DCO 310 to correct for any phase (and potentially frequency) error between the input signal 304 and the comparison signal 314 to either maintain the DPLL 300 in a locked state or to bring the DPLL 300 into a locked state.

It should be noted that, in addition to the BBPD 306, other hardware can be added to the DPLL 300 to detect a frequency error between the input signal 304 and the comparison signal 314. For example, hardware can be added to the DPLL 300 to detect some coarse frequency error between the input signal 304 and the comparison signal 314. This additional hardware can be used to improve the pull-in range of the DPLL 300, for example.

It should be further noted that the digital filter 308 and/or the DCO 310 can be replaced by their analog equivalents (i.e., implementations that receive as input and/or provide as output continuous time signals as opposed to discrete time signals). For example, the digital filter 308 can be replaced by an analog filter and/or the DCO 310 can be replaced by a voltage controlled oscillator (VCO).

Figure 4:
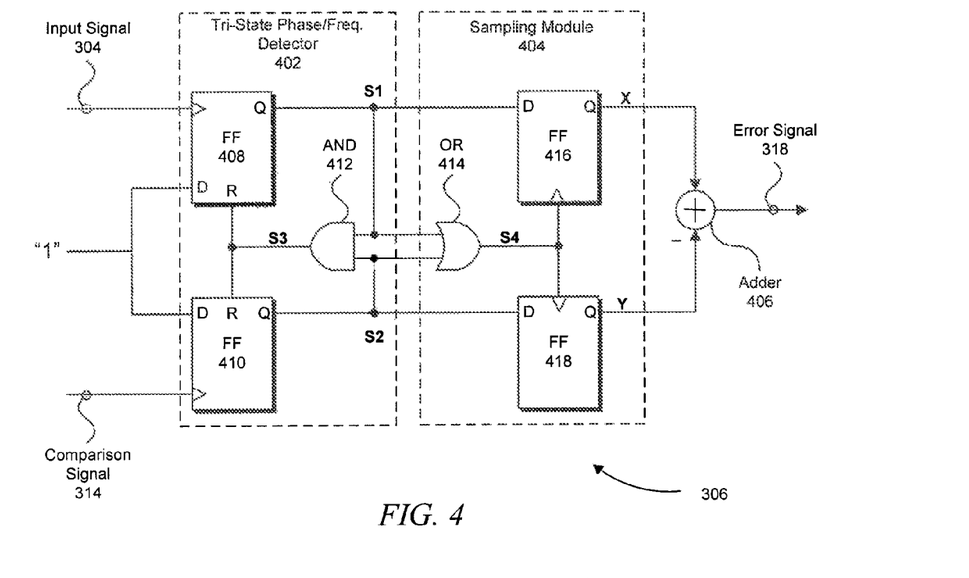
FIG. 4 illustrates an example implementation of a bang-bang phase detector (BBPD) in accordance with embodiments of the present disclosure.

Referring now to FIG. 4, an example implementation of the BBPD 306 is illustrated in accordance with embodiments of the present disclosure. As shown in FIG. 4, the BBPD 306 includes a tri-state phase/frequency detector 402, sampling module 404, and an optional summing node or adder 406.

The tri-state phase/frequency detector 402 includes a pair of flip-flops 408 and 410 (e.g. D-type flip-flops) as well as an AND-gate 412. The two inputs of the AND-gate 412 are respectively coupled to the outputs of the flip-flops 408 and 410, and the output of the AND-gate 412 is coupled to the reset input of each flip-flop 408 and 410. The tri-state phase/frequency detector 402 has two outputs labeled as S1 and S2 in FIG. 4. A logical high signal on S1 indicates that the phase of the input signal 304 is lagging the phase of the comparison signal 314. A logical high signal on S2 indicates the opposite, i.e., that the phase of the input signal 304 is leading the phase of the comparison signal 314. In general, lock is achieved when both outputs S1 and S2 are set to zero. Note that both outputs S1 and S2 generally cannot be set to a logical high signal simultaneously because the AND-gate 412 would immediately reset the flip-flops 408 and 410.

The outputs S1 and S2 are sampled by sampling module 404 upon a rising edge in either S1 or S2. Sampling module 404 includes an OR-gate 414 to detect a rising edge in either S1 or S2 and two flip-flops 416 and 418 for sampling S1 and S2 and storing the samples upon the OR-gate 414 detecting a rising edge in either S1 or S2. The sampled values are respectively labeled as X and Y in FIG. 4.

The samples X and Y are combined using adder 406 to generate the error signal 318. When the error signal 318 is positive one (i.e., when X is one and Y is zero), the input signal 304 is determined to be lagging the comparison signal. When the error signal 318 is negative one (i.e., when X is zero and Y is one), the input signal 304 is determined to be leading the comparison signal. Finally, when the error signal is zero (i.e., when X is zero and Y is zero), the input signal 304 and the comparison signal 314 are substantially locked in phase. Because the implementation of BBPD 306 illustrated in FIG. 4 provides three different possible outputs (i.e., +1, 0, and −1), the BBPD 306 can be referred to as a three-level output BBPD.

Figure 5:
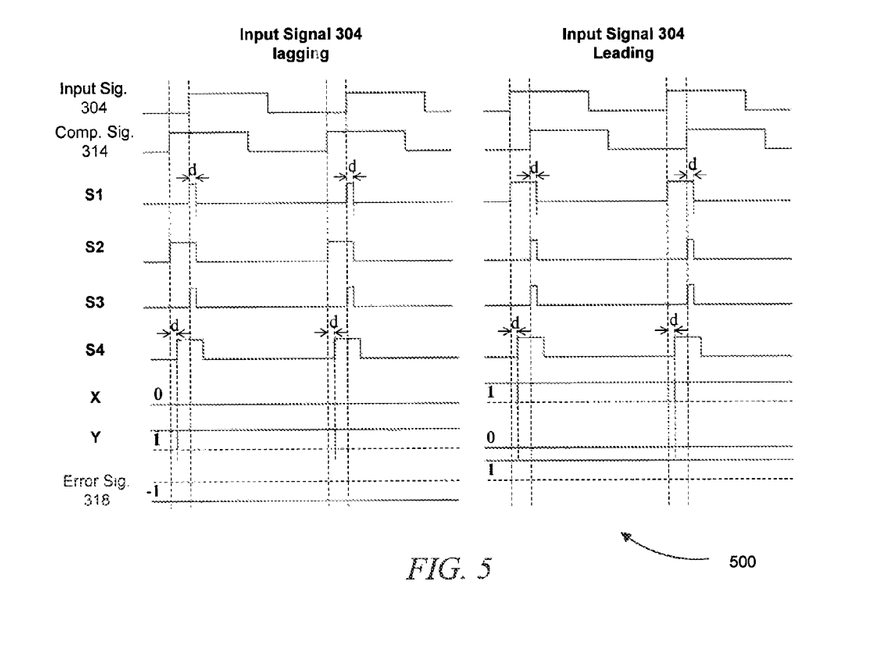
FIG. 5 illustrates a signal waveform for the BBPD depicted in FIG. 4 in accordance with embodiments of the present disclosure.

FIG. 5 illustrates a signal waveform 500 that further depicts the operation of the BBPD 306 shown in FIG. 4. The first portion of the signal waveform 500 illustrates the operation of the BBPD 306 when the phase of the input signal 304 is lagging the phase of the comparison signal 314. The second portion of the signal waveform 500 illustrates the operation of the BBPD 306 when the phase of the input signal 304 is leading the phase of the comparison signal 314. The time "d" denotes the small technology dependent delay associated with the AND-gate 412 and the OR-gate 414.

It should be noted that the implementation of the BBPD 306 illustrated in FIG. 4 is provided by way of example and not limitation. Other implementations of the BBPD 306 are possible. For example, and in general, any reasonable implementation of the BBPD 306 that provides a three-level output can be used. In addition, two-level output implementations of the BBPD 306 are also possible. For example, the BBPD 306 can be implemented as simple as a single flip-flop that stores samples of the comparison signal 314 and is clocked by the input signal 304.

It should be further noted that the adder 406 shown in FIG. 4 is optionally included. In other embodiments, the adder 406 can be omitted and the X and Y outputs of the flip-flops 416 and 418 can be logically combined using other hardware or logic gates to determine whether the input signal 304 is leading, lagging, or substantially in sync with the phase of the comparison signal 314.

In comparison to the TDC, which generally requires a long chain of delay gates (e.g., buffers or inverters) in order to achieve a fine resolution, it can be shown that the BBPD, such as the implementation of the BBPD 306 illustrated in FIG. 4, can provide a very fine resolution without the demanding hardware and/or power requirements of the TDC. This fine resolution allows the BBPD to determine whether the phase of the input signal 304 is leading or lagging the phase of the comparison signal 314 even when there is a small phase difference between the two signals, such as during lock. This helps to eliminate spurious tones in the output signal generated by the DPLL that are common to DPLLs that include TDC based phase detectors.

However, the replacement of a TDC based phase detector with a BBPD in many DPLLs is not without its tradeoffs. In particular, in fractional-N DPLLs the use of a BBPD in place of the TDC based phase detector can often introduce spurs in the output signal for reasons other than those discussed above. This issue is explained further below in regard to FIGS. 6 and 7.

Figure 6:
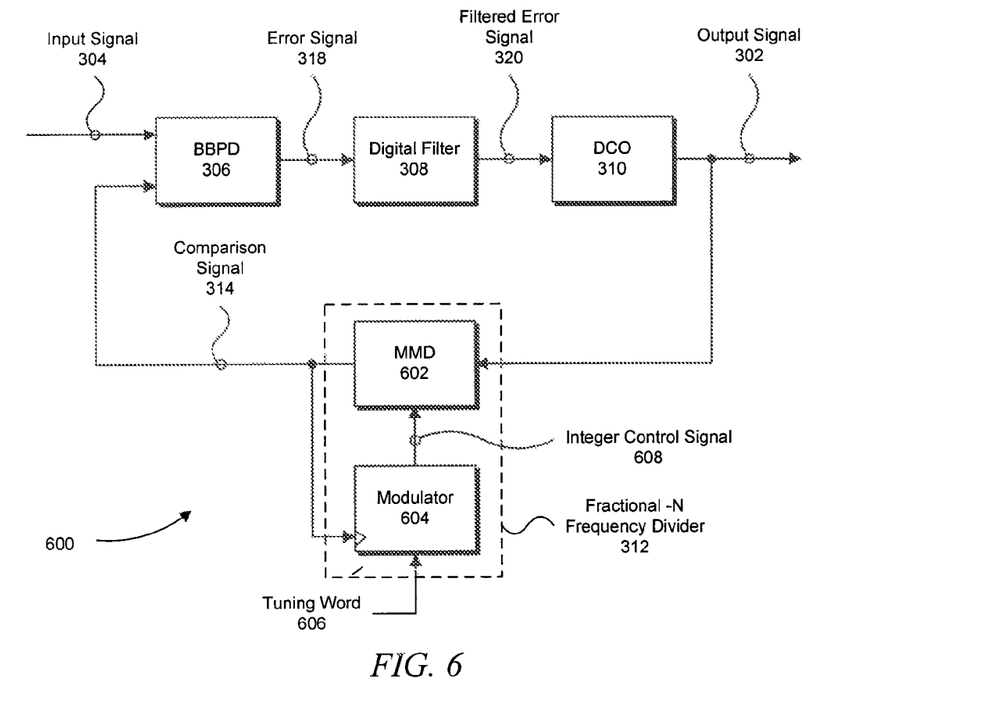
FIG. 6 illustrates a DPLL with a BBPD in accordance with embodiments of the present disclosure.

FIG. 6 illustrates a DPLL 600 in accordance with embodiments of the present disclosure. The DPLL 600 has a similar architecture as the DPLL 300 illustrated in FIG. 3. However, the fractional-N frequency divider 312 is specifically shown as being implemented by a multi-modulus divider (MMD) 602 and a modulator 604.

In operation, the MMD 602 is configured to reduce the frequency of the output signal 302 using two or more integer division factors to generate the comparison signal 314. More specifically, the modulator 604 controls the MMD 602 to alternately select the different integer division factors such that the MMD 602 reduces the frequency of the output signal 302, on average, by the division factor 316, which has an integer (N) and fractional (f) part. The modulator 604 includes at least one phase error accumulator for the purposes of determining when to adjust the integer division factor of the MMD 602.

For example, the MMD 602 can be implemented as a dual-modulus divider that reduces the frequency of the output signal 302 by two integer division factors: N and N+1, where N is set equal to the integer portion of the division factor 316. The phase error accumulator of the modulator 604 is clocked by the comparison signal 314 and increments by an amount determined by a tuning word 606 with each pulse of the comparison signal 314. When the phase error accumulator overflows, the divider ratio of the MMD 602 can be controlled by the modulator 604, using integer control signal 608, to be set to the division factor N+1 for one cycle of the comparison signal 314 and to the division factor N at all other times.

For example, if the division factor 316 is 5.2, the modulator 604 can control the MMD 602 to alternately switch between the division factors of five and six such that the comparison signal 314 has an average frequency that is 5.2 times slower than the frequency of the output signal 302. The modulator 604 can specifically control the MMD 602, using integer control signal 608, to use the division factor five for the first four pulses of the comparison signal 314 and then switch to the division factor six for the next pulse of the comparison signal 314. This division factor selection sequence (i.e., 5, 5, 5, 5, 6) can then be repeated thereafter. As can be easily verified, this division factor selection sequence will provide the comparison signal 314 with an average frequency that is 5.2 times slower than the frequency of the output signal 302.

To control the MMD 602 to alternately select the division factor five and the division factor six according to the division factor selection sequence noted above, the tuning word 606 needs to be appropriately set. For example, if we assume that the modulus of the accumulator of modulator 604 is equal to one, then the tuning word 606 can be set equal to 0.2 to provide the desired control of the MMD 602. Setting the tuning word 606 equal to 0.2 means that, for each pulse of the comparison signal 314, the accumulator of modulator 604 increments by 0.2 and for every five pulses of the comparison signal 314 the accumulator overflows. Thus, setting the tuning word 606 to be equal to 0.2 causes the MMD 602 to use the division factor of five for the first four pulses of the output signal and then, when the accumulator of the modulator 606 overflows on the fifth pulse, switch to the division factor of six for the fifth pulse of the comparison signal 314 as desired.

It should be noted that in other implementations, the MMD 602 can include more than two division factors and the modulator 604 can include more than one accumulator. The dual-modulus implementation of the MMD 602 and the single accumulator implementation of the modulator 604 are provided by way of example and not limitation.

Figure 7:
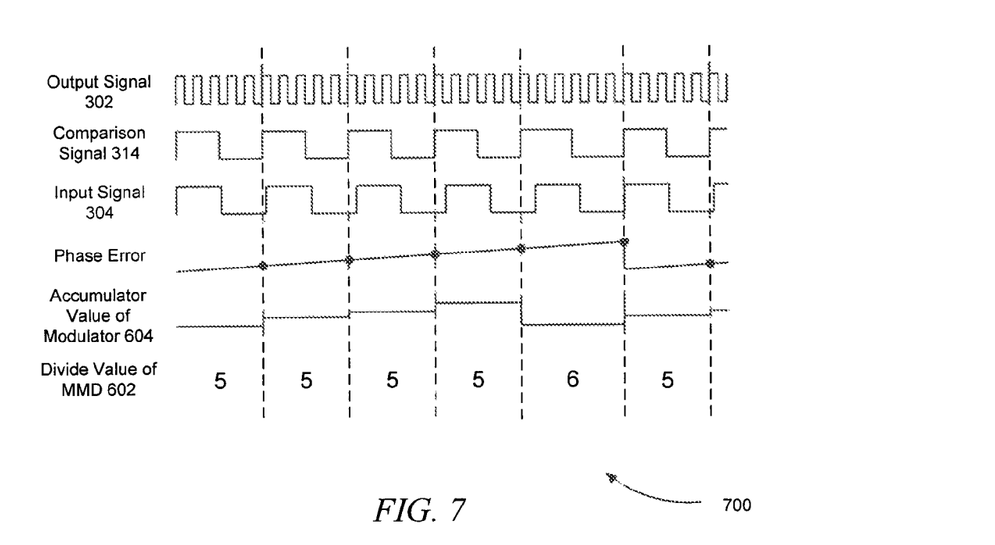
FIG. 7 illustrates a signal waveform for the DPLL depicted in FIG. 6 in accordance with embodiments of the present disclosure.

FIG. 7 provides a signal waveform 700 that further illustrates the operation of the MMD 602 and the modulator 604 in the DPLL 600. The signal waveform 700 assumes, for illustration purposes, that the division factor 316 is equal to 5.2, the MMD 602 is a dual-modulus divider with two division factors five and six, and the modulator 604 includes a single accumulator with a modulus of one and a tuning word of 0.2 as described above.

As can be seen from the signal waveform 700, the use of integer division factors by the MMD 602 that are not exactly equal to the fractional division factor 316 introduces phase noise into the comparison signal 314. The phase noise of the comparison signal 314 increases during accumulation of the tuning word 606 by the accumulator of modulator 604 and then is reduced back down to zero (in at least this example) when the accumulator overflows. Because of the periodic nature and abrupt changes in the phase noise of the comparison signal 314, spurs can be introduced into the frequency domain of the output signal 302.

In DPLLs that implement a TDC based phase detector, this phase noise due to the MMD 602 is often tracked and canceled at the output of the TDC. However, because the BBPD 306 indicates whether the comparison signal 314 is leading or lagging the input signal 304 and does not include information as to the magnitude of the difference in phase between the input signal 304 and the comparison signal 314 at its output like the TDC, this cancellation scheme generally cannot be performed in the DPLL 600.

Moreover, the benefit of the BBPD 306 over the conventional implementation of the TDC is its finer resolution. This finer resolution, however, generally cannot be exploited (even if it were possible to reduce or eliminate the phase noise due to the MMD 602 at the output of the BBPD 306) because the phase noise often prevents the phase of the comparison signal 314 from becoming very close to the phase of the input signal 304. The phase noise due to the MMD 602 generally needs to be reduced or eliminated before the comparison signal 314 is received and processed by the BBPD 306 in order to exploit the fine resolution of the BBPD 306.

The following section describes and illustrates a solution for reducing or eliminating the phase noise in the comparison signal 314 due to the MMD 602 before the comparison signal 314 is received and processed by the BBPD 306.

III. REDUCED PHASE NOISE ARCHITECTURE OF FRACTIONAL-N DIGITAL PHASE-LOCKED LOOP WITH BANG-BANG PHASE DETECTOR

Figure 8:
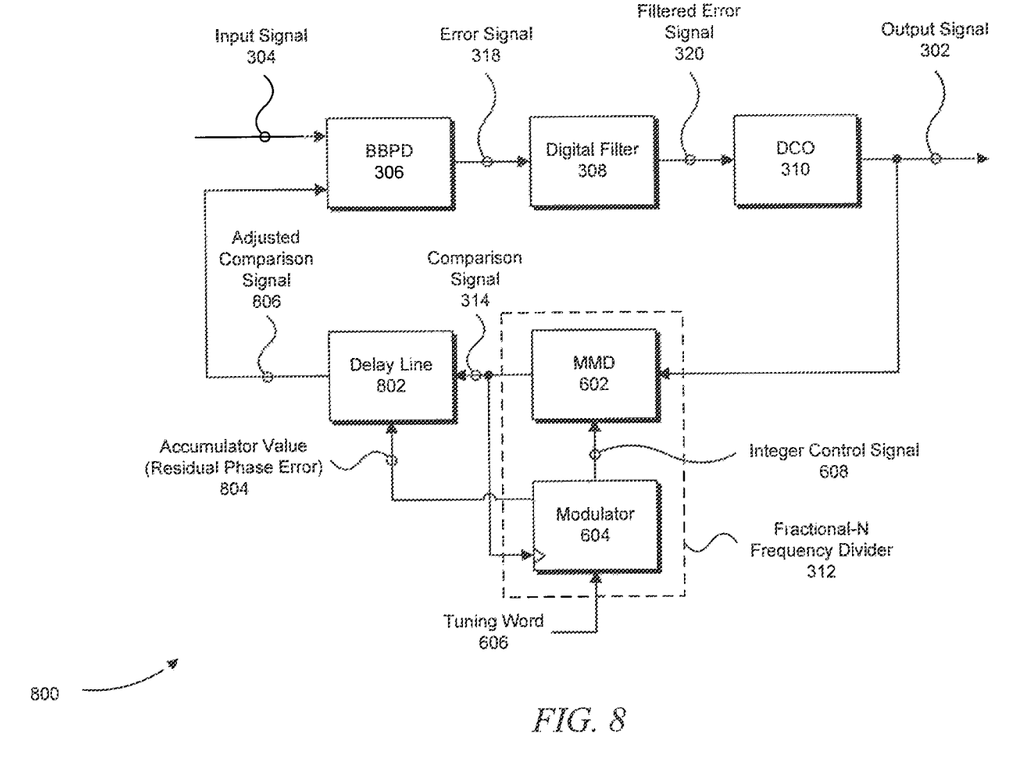
FIG. 8 illustrates a DPLL with a BBPD in accordance with embodiments of the present disclosure.

FIG. 8 illustrates a DPLL 800 in accordance with embodiments of the present disclosure. The DPLL 800 has a similar architecture as the DPLL 600 illustrated in FIG. 6. However, an additional delay line 802 has been added to the DPLL 800. In general, the delay line 802 is configured to delay the comparison signal 314 so as to compensate for the phase noise introduced into the comparison signal 314 by the MMD 602.

For example, the delay line 802 is configured to delay the comparison signal 314 to better align the rising (and/or falling) edges of the comparison signal 314 with the rising (and/or falling) edges of the input signal 304. As can be seen from the signal waveform 700 in FIG. 7, the phase error in the comparison signal 314 is generally proportional to the value in the accumulator of the modulator 604. Thus, the delay of the delay line 802 can be varied based on the value in the accumulator of the modulator 604 in order to compensate for the phase noise introduced into the comparison signal 314 by the MMD 602. FIG. 8 illustrates the accumulator value 804 being received as input by the delay line 802 for this purpose. The output of the delay line 802 is labeled as adjusted comparison signal 806 in FIG. 8.

Figure 9:
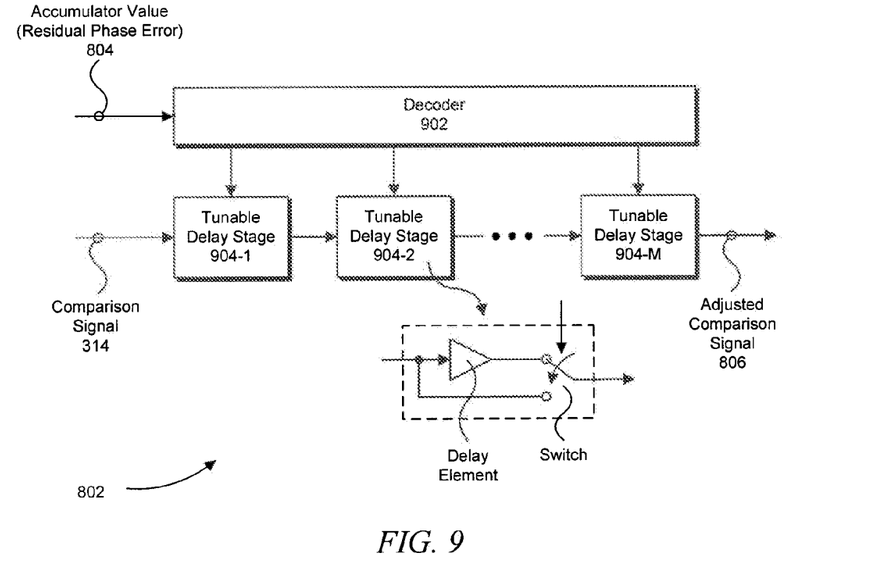
FIG. 9 illustrates an example implementation of a delay line in accordance with embodiments of the present disclosure.

FIG. 9 illustrates an example implementation of the delay line 802 in accordance with embodiments of the present disclosure. The delay line 802, illustrated in FIG. 9, includes a decoder 902 and a plurality of series coupled tunable delay stages 904-1 through 904-M.

In operation, the plurality of series coupled tunable delay stages 904-1 through 904-M receive the comparison signal 314 and delay the comparison signal 314 by a variable amount to provide the adjusted comparison signal 806 as output. The amount by which the comparison signal 314 is delayed by the plurality of series coupled tunable delay stages 904-1 through 904-M is determined by a control signal provided as output by the decoder 902. The control signal is specifically determined by the decoder 902 based on the accumulator value 804.

One possible method that can be used by the decoder 902 to determine the control signal based on the accumulator value 804 is described here. As noted above, the accumulator value 804 is proportional to the phase error in the comparison signal 314 and can be expressed in units of cycles of the output signal 302 provided by the DCO 310. For example, if the modulator 604 has a modulus M, the accumulator value 804 divided by the modulus M gives the current phase error in the comparison signal 314 in units of cycles of the output signal 302.

Thus, if the modulator 604 has a modulus of 100 and the accumulator value 804 is 50, the current phase error in the comparison signal 314 is approximately equal to $50/100$ cycles of the output signal 302, or 0.5 cycles of the output signal 302. Given the time duration of one cycle of the output signal 302 (i.e., given the period of oscillation of the output signal 302), the amount of delay needed to compensate for the current phase error in the comparison signal 314 can be determined.

For example, assuming that the current phase error in the comparison signal 314 is determined to be 0.5 cycles of the output signal 302 and the period of the output signal 302 is 4 ps, the amount of delay needed to compensate for the current phase error in the comparison signal 314 is given by 0.5*4 ps or 2 ps. The decoder 902 can use this general approach to determine the amount of delay needed to compensate for the current phase error and generate the control signal for controlling the plurality of series coupled tunable delay stages 904-1 through 904-M such that the comparison signal 314 is delayed by a corresponding amount.

In at least one implementation, one or more of the tunable delay stages 904-1 through 904-M can include a by-passable delay element (e.g., a buffer or inverter). For example, and as further shown in FIG. 9, the tunable delay stage 904-2 can include a delay element and a switch. The switch can be controlled by the control signal provided by the decoder 902 to use or bypass the delay element. If more delay is desired, the control signal can control the switch to couple the output of the delay element to the output of the tunable delay stage 904-2. On the other hand, if less delay is desired, the control signal can control the switch to bypass the delay element and couple the output of the tunable delay stage 904-2 to the input of the tunable delay stage 904-2.

Figure 10:
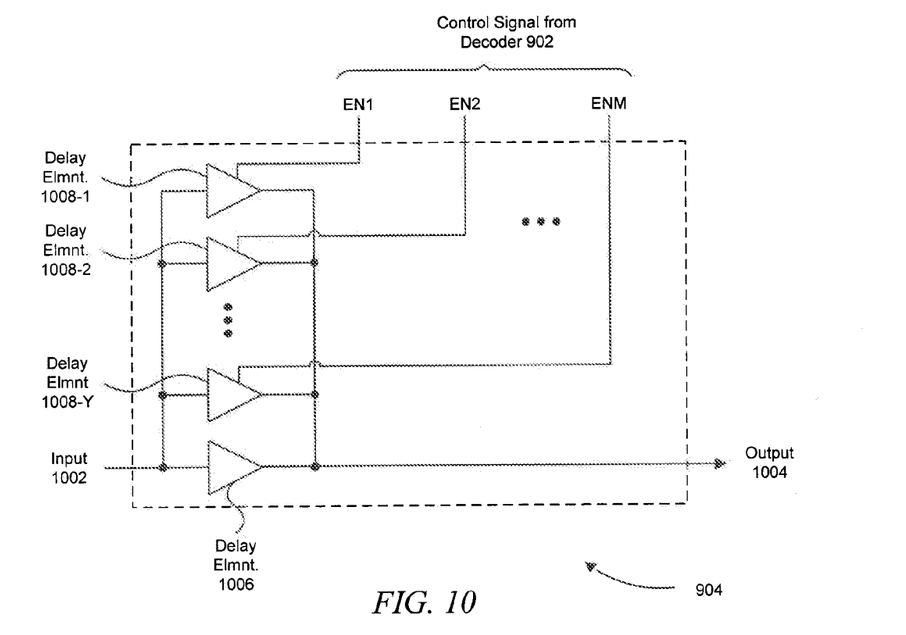
FIG. 10 illustrates an example implementation of a tunable delay stage in accordance with embodiments of the present disclosure.

FIG. 10 further illustrates another possible implementation for one or more of the tunable delay stages 904-1 through 904-M in accordance with embodiments of the present disclosure. The delay stage 904, illustrated in FIG. 10, includes a plurality of parallel coupled delay elements 1008-1 through 1008-Y and an optionally included delay element 1006. The delay elements can be, for example, buffers or inverters. The delay element 1006 and the delay elements 1008-1 through 1008-Y are configured to delay the signal received at the input 1002. The delayed signal is provided as output by the output 1004.

The delay elements 1008-1 through 1008-Y are selectively enabled and disabled by the control signal provided by the decode 902 as shown in FIG. 9. The delay of the tunable delay stage 904 is therefore adjusted by the control signal provided by the decoder 902. In general, the more of the delay elements 1008-1 through 1008-M that are enabled, the smaller the delay of the tunable delay stage 904. This is because only enabled ones of the delay elements 1008-1 through 1008-Y source and sink an output current to respectively charge and discharge the capacitive load of the next tunable delay stage or gate coupled to the output 1004. The amount of current a delay element 1008-1 through 1008-Y sources or sinks can be referred to as its drive strength. The more of the delay elements 1008-1 through 1008-M that are enabled, the larger the current used to charge and discharge the capacitive load of the next tunable delay stage or gate coupled to the output 1004, and the smaller the delay of the tunable delay stage 904 shown in FIG. 10.

In an implementation, the delay elements 1008-1 through 1008-Y are scaled in size to provide different drive strengths. For example, the delay elements 1008-1 through 1008-Y can be scaled in size to provide different drive strengths according to a binary scale.

Figure 11:
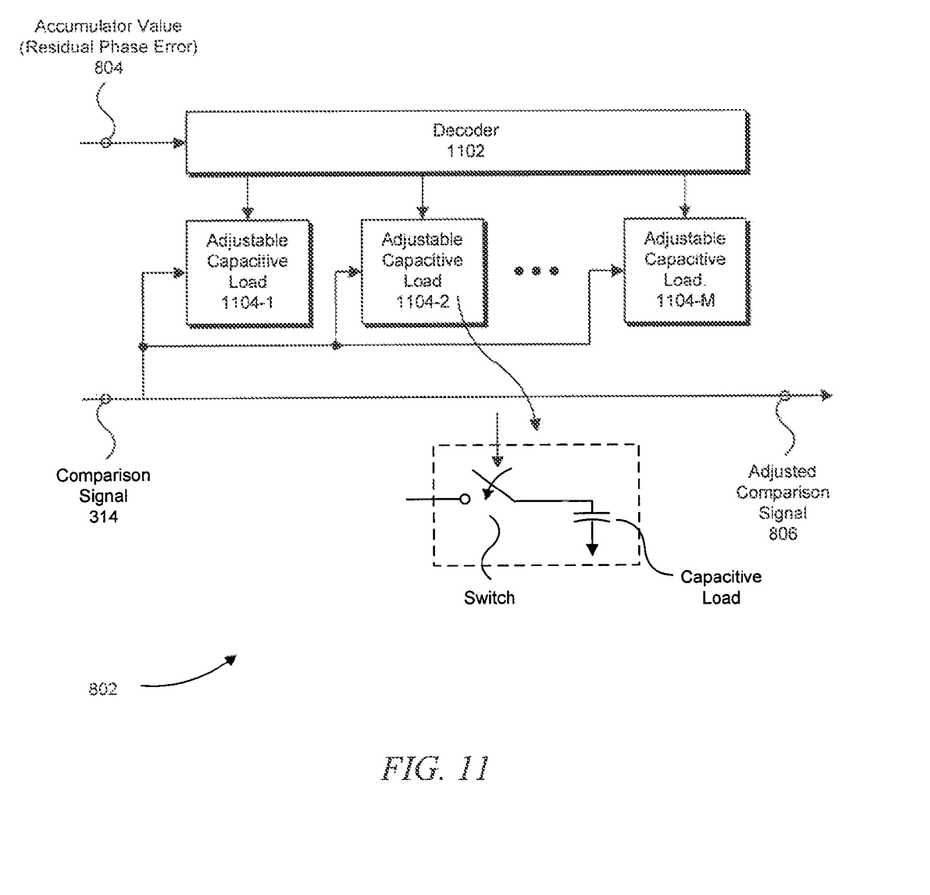
FIG. 11 illustrates an example implementation of a delay line in accordance with embodiments of the present disclosure.

Referring now to FIG. 11, another example implementation of the delay line 802 in accordance with embodiments of the present disclosure is illustrated. The delay line 802, illustrated in FIG. 11, includes a decoder 1002 and a plurality of adjustable capacitive loads 1104-1 through 1104-M.

In operation, the plurality of adjustable capacitive loads 1104-1 through 1104-M receive the comparison signal 314 and delay the comparison signal 314 by a variable amount to provide the adjusted comparison signal 806 as output. The amount by which the comparison signal is delayed by the plurality of adjustable capacitive loads 1104-1 through 1104-M is determined by a control signal provided as output by decoder 1102. The control signal is specifically determined by decoder 1102 based on the accumulator value 804. For example, the decoder 1102 can use the method discussed above in regard to the decoder 902 illustrated in FIG. 9 for generating the control signal.

In at least one implementation, one or more of the adjustable capacitive loads 1104-1 through 1104-M can include a capacitor. For example, and as further shown in FIG. 11, the adjustable capacitive load 1104-2 can include a capacitor and a switch. The switch can be controlled by the control signal provided by the decoder 1102 to use or omit the capacitor from receiving or being coupled to the comparison signal 314. If more delay is desired, the control signal can control the switch to couple the capacitor to the comparison signal 314. On the other hand, if less delay is desired, the control signal can control the switch to omit the capacitor from being coupled to the comparison signal 314.

In an implementation, capacitors included in the adjustable capacitive loads 1104-1 through 1104-M are scaled in size to provide different amounts of delay. For example, the adjustable capacitive loads 1104-1 through 1104-M can be scaled in size to provide different amounts of delay according to a binary scale.

IV. ALTERNATIVE EMBODIMENT

Figure 12:
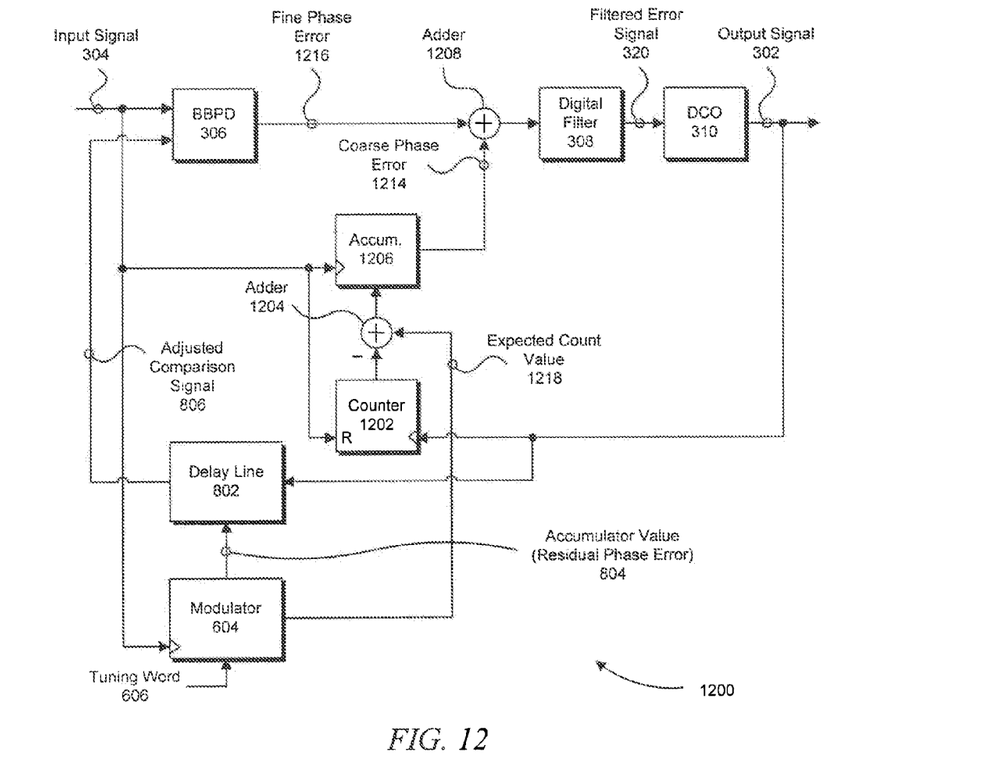
FIG. 12 illustrates a DPLL with a BBPD in accordance with embodiments of the present disclosure.

FIG. 12 illustrates another implementation of a DPLL 1200 in accordance with embodiments of the present disclosure. The DPLL 1200 has a similar architecture as the DPLL 800 illustrated in FIG. 8. However, the MMD 602 has been replaced by a counter based loop that includes a counter 1202, an adder 1204, an accumulator 1206, and another adder 1208.

As illustrated in FIG. 12, the accumulator 1206 is clocked by the input signal 304 and the counter 1202 is reset by the input signal 304. The counter 1202 estimates the number of cycles of the output signal 302 that occur during a cycle of the input signal 304 by counting rising (or falling) edges of the output signal 302. This estimate is provided as output to the adder 1204 and the counter 1202 is thereafter reset by the input signal 304. The adder 1204 then determines the difference between the output of the counter 1202 and the expected count value 1218, which is provided by modulator 604 as output, to get a coarse frequency error. The accumulator 1206 accumulates (or integrates) the coarse frequency error determined by the adder 1204 to form a coarse phase error 1214, which is then low-pass filtered by digital filter 308 and used to adjust the DCO 310.

Figure 13:
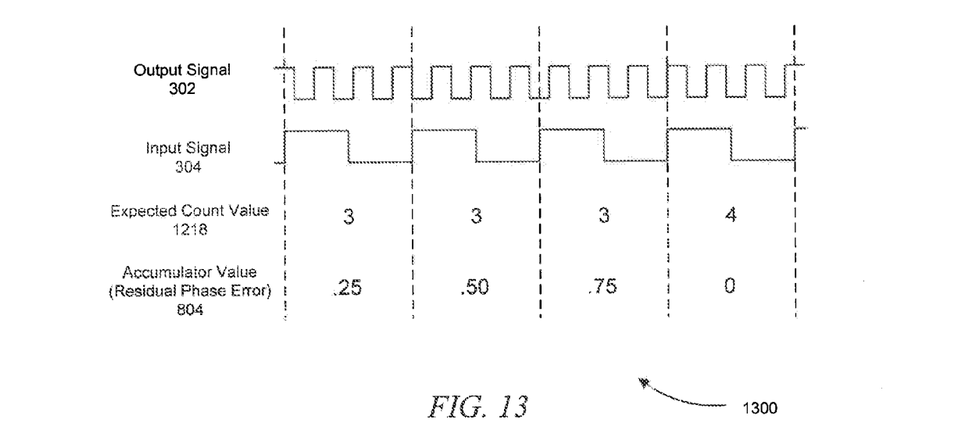
FIG. 13 illustrates a signal waveform for the DPLL depicted in FIG. 12 in accordance with embodiments of the present disclosure.

FIG. 13 provides a timing diagram 1300 that further illustrates the basic operation of the DPLL 1200 as described above. For the signals shown in the timing diagram 1300, the DPLL 1200 is assumed to be in lock, and the division factor 316 is assumed to be equal to 3.25 such that the output signal 302 has a frequency that is 3.25 times higher than the frequency of the input signal 304. As shown in FIG. 13, the timing diagram 1300 illustrates four full cycles of the input signal 304 and a portion of the output signal 302 in relation to the four cycles of the input signal 304.

Based on the signals shown in the timing diagram 1300, the counter 1202 estimates, by counting the rising edges (or falling edges in another embodiment) of the output signal 302, that three cycles of the output signal 302 occur during each of the first three cycles of the input signal 304 and that four cycles of the output signal 302 occur during the last cycle of the input signal 304. Because the counter 1202 has a resolution equal to one cycle of the output signal 302, the counter 1202 cannot accurately determine that 3.25 cycles of the output signal 302 actually occur during each of the four cycles of the input signal 304. The accumulator of modulator 604 is configured to keep track of the resulting residual phase error that the counter 1202 introduces into the system of the DPLL 1200 because of the limited resolution of the counter 1202.

For example, the counter 1202 incorrectly estimates that three cycles of the output signal occur during the first three cycles of the input signal 304 shown in the timing diagram 1300. In actuality, 3.25 cycles of the output signal occur during each of these first three cycles of the input signal 304. Thus, the accumulator of the modulator 604 will increment the residual phase error by 0.25 (or some value representative of 0.25) for each of the first three cycles of the input signal 302, resulting in an accumulator value 804 of 0.75 (or some value representative of 0.75). For the fourth cycle of the input signal 304, the counter 1202 overestimates (as opposed to underestimating as in the previous three cycles of the input signal 304) that four cycles of the output signal 302 occur when 3.25 cycles of the output signal 302 actually occur. As a result, the accumulator of the modulator 604 will reset the residual phase error to zero.

The accumulator of the modulator 604 can determine the residual phase error by incrementing the accumulator value 804 by a fractional amount (or some value representative of a fractional amount) after each cycle of the input signal 304, where the fractional amount is equal to the fractional portion of the division factor 316. Thus, for example, if the division factor is equal to 3.25, the accumulator of the modulator can increment the accumulator value 804 by 0.25 (or some value representative of this value) after each cycle of the input signal 304. As shown in the timing diagram of FIG. 13, the accumulator value 804 is incremented by 0.25 after each cycle of the input signal 304 and overflows after every four cycles of the input signal 304.

The accumulator of the modulator 604 can further determine the expected count value 1218 as shown in FIG. 12 and the timing diagram 1300 in FIG. 13. The expected count value 1218 is equal to the expected value output by counter 1202 after each cycle of the input signal 302. In general, this value is equal to the integer portion of the division factor 316 during all cycles of the input signal 304, except during the cycle of the input signal 304 when the accumulator value 804 overflows. During this cycle of the input signal 304, when the accumulator value 804 overflows, the expected count value 1218 is set equal to the integer portion of the division factor 316 plus one.

Referring back to FIG. 12, the BBPD 306 is further included and used to determine a fine phase error 1216 between the input signal 304 and the output signal 302. However, before the BBPD 306 determines the fine phase error 1216 between the input signal 304 and the output signal 302, the delay line 802 is used to delay the output signal 302 by an amount proportional to the accumulator value 804 (i.e., by an amount proportional to the residual phase error). For example, if the accumulator value 804 is equal to 0.25, or some value representative of 0.25, the delay line can delay the output signal 302 by an amount equal to 0.25 times time the duration of a single period of the input signal 304. The delay line can be implemented as shown in FIG. 9-11, for example.

Figure 14:
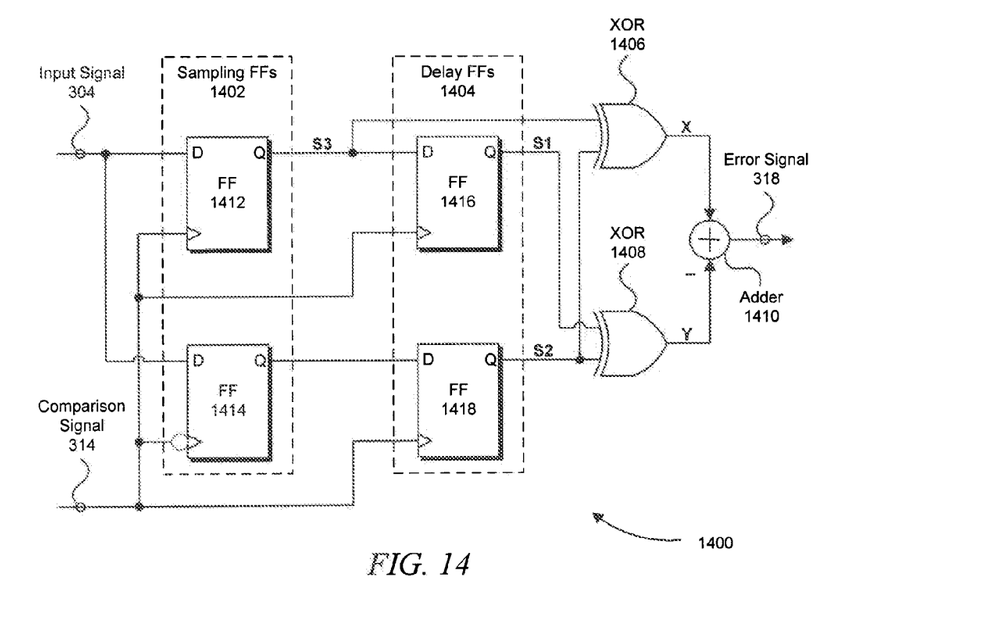
FIG. 14 illustrates an example implementation of a bang-bang phase detector (BBPD) in accordance with embodiments of the present disclosure.

Referring now to FIG. 14, an example implementation of the BBPD 306 that can be used in the DPLL 1200 is illustrated in accordance with embodiments of the present disclosure. As shown in FIG. 14, the BBPD 306 includes sampling flip-flops 1402, delay flip-flops 1404, a pair of XOR gates 1406 and 1408, and an (optional) adder 1410.

Figure 15:
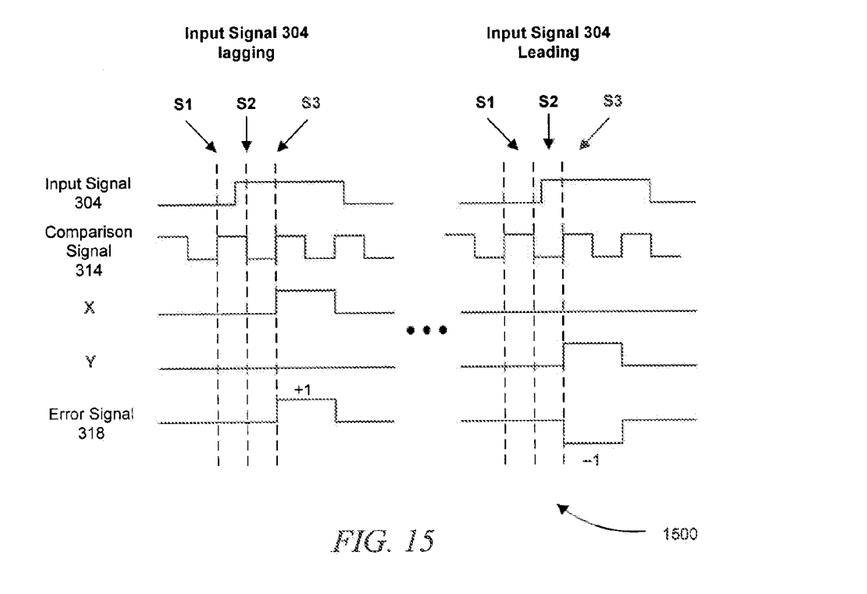
FIG. 15 illustrates a signal waveform for the BBPD depicted in FIG. 14 in accordance with embodiments of the present disclosure.

In operation, the BBPD 306 uses the sampling flip-flops 1402 to take three samples of the input signal 304 during a cycle of the comparison signal 314. The signal waveform 1500 in FIG. 15 illustrates these three samples, S1, S2, and S3, taken from an example input signal 304 during a cycle of the comparison signal 314. The first sample S1 of the input signal 304 is taken by the flip-flip 1412 upon receipt of a rising edge of the comparison signal 314, and the second sample S2 of the input signal 304 is taken thereafter by the flip-flop 1414 upon the subsequent falling edge of the comparison signal 314. As shown in FIG. 14, the clock input to the flip-flip 1414 is negated such that flip-flop 1414 takes the sample S2 upon the subsequent falling edge of the comparison signal 314. These two samples, S1 and S2, of the input signal 304 are then stored and delayed by the flip-flop 1416 and the flip-flop 1418, respectively, upon receipt of the next rising edge of the comparison signal 314. In addition, upon receipt of this next rising edge of the comparison signal 314, the third sample S3 of the input signal 304 is taken by the flip-flop 1412.

Using these three samples, the XOR gate 1406, the XOR gate 1408, and the adder 1410 determine (1) whether there was a transition in the input signal 304 during the cycle of the comparison signal 314 over which the three samples, S1, S2, and S3, were taken and, if a transition occurred, (2) whether the phase of the input signal 304 is leading or lagging the phase of the comparison signal 314. If there was no transition, the error signal 318 is zero. If there was a transition and the phase of the input signal 304 is lagging the phase of the comparison signal 314, the error signal 318 is positive one. If there was a transition and the phase of the input signal 304 is leading the phase of the comparison signal 314, the error signal 318 is negative one.

More specifically, when there is no transition in the input signal 304, S1=S2=S3 and the respective outputs, X and Y, of the XOR gates 1406 and 1408 are both equal to zero. Thus, the addition of X and minus Y by adder 1410 gives an error signal 318 equal to zero. When there is a transition in the input signal 304 and the phase of the input signal 304 is lagging the phase of the comparison signal 314, as shown in the first portion of the signal waveform 1500 illustrated in FIG. 15, X=1 and Y=0. Thus, the addition of X and minus Y by the adder 1410 gives an error signal 318 equal to positive one. Finally, when there is a transition in the input signal 304 and the phase of the input signal 304 is leading the phase of the comparison signal 314, as shown in the second portion of the signal waveform 1500 illustrated in FIG. 15, X=0 and Y=1. Thus, the addition of X and minus Y by the adder 1410 gives an error signal 318 equal to negative one.

It should be noted that the implementation of the BBPD 306 illustrated in FIG. 14 is provided by way of example and not limitation. Other implementations of the BBPD 306 that can be used in the DPLL 1200 shown in FIG. 12 are possible. For example, and in general, any reasonable implementation of the BBPD 306 that takes at least three samples of the input signal 304 during a cycle of the comparison signal 314 and uses the three samples to determine (1) whether a transition in the input signal 304 occurred and, if a transition occurred, (2) whether the phase of the input signal 304 is leading or lagging the phase of the comparison signal 314 can be used. Other implementations of the BBPD 306 are also possible. For example, BBPD 306 can be implemented as shown in FIG. 4.

It should be further noted that the adder 1410 shown in FIG. 14 is optionally included. In other embodiments, the adder 1410 can be omitted and the X and Y outputs of the XOR gates 1406 and 1408 can be logically combined using other hardware or logic gates to determine whether a transition in the input signal 304 occurred and, if a transition occurred, whether the phase of the input signal 304 is leading or lagging the phase of the comparison signal 314.

V. CONCLUSION

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

What is claimed is:

1. A phase-locked loop (PLL) for maintaining, a phase relationship between an output signal and an input signal, the PLL comprising:
a multi-modulus divider (MMD) configured to reduce a frequency of the output signal by a fractional division factor to provide a comparison signal;
a modulator configured to increment an accumulator value after a cycle of the comparison signal and control the MMD based on the accumulator value to alternately reduce the frequency of the output signal by at least two integer division factors to provide the comparison signal;
a delay line configured to delay the comparison signal based on the accumulator value to provide an adjusted comparison signal; and
a bang-bang phase detector (BBPD) configured to detect a difference in phase between the input signal and the adjusted comparison signal to adjust a phase of the output signal to maintain the phase relationship.

2. The PLL of claim 1, wherein the delay line comprises:
a plurality of series coupled delay stages configured to delay the comparison signal based on a control signal to provide the adjusted comparison signal.

3. The PLL of claim 2, wherein at least one of the delay stages is configured to be bypassed based on the control signal.

4. The PLL of claim 2, wherein at least one of the delay stages comprises a plurality of delay elements coupled in parallel and individually enabled and disabled by the control signal.

5. The PLL of claim 4, wherein the plurality of delay elements are scaled in size to provide different drive strengths.

6. The PLL of claim 1, wherein the delay line comprises:
an adjustable capacitive load configured to be adjusted based on a control signal.

7. The PLL of claim 1, wherein the delay line comprises:
a decoder configured to convert the accumulator value into a control signal such that the comparison signal is delayed by an amount determined based on the accumulator value.

8. The PLL of claim 1, further comprising:
a digital filter configured to low-pass filter the difference in phase.

9. The PLL of claim 1, further comprising:
a digitally controlled oscillator configured to provide the output signal and adjust the frequency of the output signal based on the difference in phase.

10. The PLL of claim 1, wherein the MMD is a dual modulus divider and the modulator is a first order delta sigma modulator.

11. The PLL of claim 1, wherein the BBPD is a three-level output BBPD.

12. A phase-locked loop (PLL) for maintaining a phase relationship between an output signal and an input signal, the PLL comprising:
a multi-modulus divider (MMD) configured to reduce a frequency of the output signal by a fractional division factor to provide a comparison signal;
a modulator configured to increment an accumulator value after a cycle of the comparison signal;
a delay line configured to delay the comparison signal based on the accumulator value to provide an adjusted comparison signal; and
a bang-bang phase detector (BBPD) configured to provide a three-level output signal that indicates whether a phase of the input signal is leading, lagging or substantially in sync with a phase of the adjusted comparison signal.

13. The PLL of claim 12, wherein the delay line comprises:
a plurality of series coupled delay stages configured to delay the comparison signal based on a control signal to provide the adjusted comparison signal.

14. The PLL of claim 13, wherein at least one of the delay stages is configured to be bypassed based on the control signal.

15. The PLL of claim 13, wherein at least one of the delay stages comprises a plurality of delay elements coupled in parallel and individually enabled and disabled by the control signal.

16. The PLL of claim 12, wherein the delay line comprises:
an adjustable capacitive load configured to be adjusted based on a control signal.

17. The PLL of claim 12, wherein the delay line comprises:
a decoder configured to convert the accumulator value into a control signal such that the comparison signal is delayed by an amount determined based on the accumulator value.

18. A phase-locked loop (PLL) for maintaining a phase relationship between an output signal and an input signal, the PLL comprising:
a multi-modulus divider (MMD) configured to reduce a frequency of the output signal by a fractional division factor to provide a comparison signal;
a modulator configured to increment an accumulator value after a cycle of the comparison signal;
a delay line configured to delay the comparison signal based on the accumulator value, using a plurality of series coupled delay stages, to provide an adjusted comparison signal; and
a flip-flop configured to detect a difference in phase between the input signal and the adjusted comparison signal to adjust a phase of the output signal to maintain the phase relationship.

19. The PLL of claim 18, wherein the delay line comprises:
a decoder configured to convert the accumulator value into a control signal such that the comparison signal is delayed by an amount determined based on the accumulator value.

* * * * *

UNITED STATES PATENT AND TRADEMARK OFFICE
CERTIFICATE OF CORRECTION

PATENT NO. : 8,471,611 B2
APPLICATION NO. : 13/466760
DATED : June 25, 2013
INVENTOR(S) : Georgios Sfikas It is certified that error appears in the above-identified patent and that said Letters Patent is hereby corrected as shown below:

In the Claims

Column 13, Line 51, Claim 1, please replace "maintaining, a" with --maintaining a--.

Signed and Sealed this
Twentieth Day of August, 2013

Teresa Stanek Rea
*Acting Director of the United States Patent and Trademark Office*